United States Patent
Luo et al.

(10) Patent No.: US 12,424,974 B2
(45) Date of Patent: Sep. 23, 2025

(54) DETECTION DEVICE FOR PHOTOVOLTAIC ASSEMBLY

(71) Applicant: ALTENERGY POWER SYSTEM INC., Zhejiang (CN)

(72) Inventors: Yuhao Luo, Zhejiang (CN); Dongming Zhou, Zhejiang (CN); Xuan Zhu, Zhejiang (CN)

(73) Assignee: ALTENERGY POWER SYSTEM INC., Zhejiang (CN)

( * ) Notice: Subject to any disclaimer, the term of this patent is extended or adjusted under 35 U.S.C. 154(b) by 138 days.

(21) Appl. No.: 18/273,442

(22) PCT Filed: Jan. 17, 2022

(86) PCT No.: PCT/CN2022/072279
§ 371 (c)(1),
(2) Date: Jul. 20, 2023

(87) PCT Pub. No.: WO2022/156619
PCT Pub. Date: Jul. 28, 2022

(65) Prior Publication Data
US 2024/0088833 A1  Mar. 14, 2024

(30) Foreign Application Priority Data
Jan. 20, 2021 (CN) .......................... 202120151194.0

(51) Int. Cl.
*H02S 50/10* (2014.01)
*H02S 40/36* (2014.01)

(52) U.S. Cl.
CPC .............. *H02S 50/10* (2014.12); *H02S 40/36* (2014.12)

(58) Field of Classification Search
CPC .......... H02S 40/36; H02S 50/10; H02S 50/00; Y02E 10/50
See application file for complete search history.

(56) References Cited

U.S. PATENT DOCUMENTS

| | | | |
|---|---|---|---|
| 6,278,279 B1 * | 8/2001 | Daun-Lindberg | ...... H02S 50/10 324/427 |
| 2007/0201252 A1 | 8/2007 | Yang et al. | |
| | | (Continued) | |

FOREIGN PATENT DOCUMENTS

| CN | 102005742 A | 4/2011 |
|---|---|---|
| CN | 105553421 A | 5/2016 |

(Continued)

OTHER PUBLICATIONS

International Search Report for PCT/CN2022/072279 mailed Mar. 22, 2022, ISA/CN.

*Primary Examiner* — Judy Nguyen
*Assistant Examiner* — Adam S Clarke
(74) *Attorney, Agent, or Firm* — Yue (Robert) Xu; Apex Attorneys at Law, LLP (57) ABSTRACT

Provided is a detection apparatus for a photovoltaic component, including a detection device and a control device. An input terminal of the detection device is connected to an output terminal of the breaking device. The detection device is configured to detect, based on at least one of a voltage and a current outputted from the photovoltaic component, whether the photovoltaic component and a connection circuit for the photovoltaic component operate normally. The control device is connected with the breaking device and the detection device. The control device is configured to control to switch on the breaking device, to transmit the at least one of a voltage and a current outputted from the photovoltaic component to the detection device.

9 Claims, 4 Drawing Sheets

(56) References Cited

U.S. PATENT DOCUMENTS

| | | | |
|---|---|---|---|
| 2014/0146427 A1 | 5/2014 | Huang et al. | |
| 2020/0280184 A1* | 9/2020 | Ojika | H02J 1/10 |
| 2021/0075334 A1* | 3/2021 | Stark | H02M 1/08 |
| 2021/0391710 A1* | 12/2021 | Yang | H02H 1/0007 |

FOREIGN PATENT DOCUMENTS

| | | | | |
|---|---|---|---|---|
| CN | 107959475 A | | 4/2018 | |
| CN | 110022130 A | | 7/2019 | |
| CN | 110412414 A | | 11/2019 | |
| CN | 111585307 A | * | 8/2020 | ....... H01L 31/02021 |
| CN | 112367049 A | | 2/2021 | |
| CN | 214045571 U | | 8/2021 | |
| CN | 113541602 A | | 10/2021 | |
| JP | 2015073377 A | | 4/2015 | |
| KR | 102000684 B1 | | 7/2019 | |

\* cited by examiner

DETECTION DEVICE FOR PHOTOVOLTAIC ASSEMBLY

CROSS REFERENCE OF RELATED APPLICATION

This application is the national phase of International Application No. PCT/CN2022/072279, titled "DETECTION DEVICE FOR PHOTOVOLTAIC ASSEMBLY", filed on Jan. 17, 2022, which claims priority to Chinese Patent Application No. 202120151194.0, titled "DETECTION DEVICE FOR PHOTOVOLTAIC ASSEMBLY", filed on Jan. 20, 2021 with the China National Intellectual Property Administration, both of which are incorporated herein by reference in their entireties.

FIELD

The present disclosure relates to the field of renewable energy, and in particular to a detection apparatus for a photovoltaic component.

BACKGROUND

Technology of photovoltaic grid-connected power generation develops rapidly by virtue of renewability and cleaning of solar energy. In a conventional photovoltaic system, multiple photovoltaic components are connected in series as a photovoltaic string. The photovoltaic string is connected to an inverter, so that a direct current outputted from the photovoltaic string is converted into an alternating current, and the alternating current is inputted to the grid. Before connecting the photovoltaic string to the inverter, a photovoltaic array test is usually performed on the photovoltaic string, and it is determined, based on a test result, whether the photovoltaic component is damaged, whether a cable is damaged, or whether a connection is poor. In the test, an output terminal of the photovoltaic string is connected to a photovoltaic array tester. For each of the photovoltaic components, an output terminal of the photovoltaic component is connected to a breaking device, in order to avoid effect of operation of the photovoltaic system on safety of users. The breaking device disconnects an output of the photovoltaic component in a case of failing to receive a starting signal, so as to ensure the safety of users. In the photovoltaic array test on the photovoltaic string, outputs of the output terminals of the photovoltaic components are disconnected by the breaking devices, so that the photovoltaic components cannot output a current and a voltage. Therefore, the photovoltaic array test cannot be performed, and a fault of the photovoltaic string cannot be detected.

SUMMARY

An objective of the present disclosure is to provide a detection apparatus for a photovoltaic component, which can control to switch on a breaking device connected to an output terminal of the photovoltaic component. Therefore, a voltage or current is outputted from the photovoltaic component to the detection apparatus, and the detection apparatus detects, based on the voltage or current outputted form the photovoltaic component, whether the photovoltaic component and a connection circuit for the photovoltaic component operate normally. In this way, a photovoltaic array test for detecting a fault of a photovoltaic string can be performed, so that normal operation of the photovoltaic component is ensured.

In order to solve the above technical problems, a detection apparatus for a photovoltaic component is provided according to the present disclosure. An output terminal of the photovoltaic component is connected to a breaking device, and the detection apparatus includes: a detection device, which has an input terminal of the detection device is connected to an output terminal of the breaking device, where the detection device is configured to detect, based on a voltage and/or a current outputted from the photovoltaic component, whether the photovoltaic component and a connection circuit for the photovoltaic component operate normally; and a control device connected with the breaking device and the detection device, where the control device is configured to control to switch on the breaking device, to transmit the voltage and/or the current outputted from the photovoltaic component to the detection device.

Preferably, the detection apparatus further includes: a power supply, which has an output terminal of the power supply is connected to a power input terminal of the control device, where the power supply is configured to supply power to the control device.

Preferably, the power supply is a mobile power bank.

Preferably, the detection apparatus further includes: a prompting device connected to the detection device, where the prompting device is configured to provide a prompt to a user based on a detection result of the detection device.

Preferably, the prompting device is at least one of a sound prompting device and a visual prompting device.

Preferably, the sound prompting device is a buzzer, and the visual prompting device is an indicator lamp.

Preferably, the control device includes: a control signal generating device, where a power input terminal of the control signal generating device serves as a power input terminal of the control device, and the control signal generating device is configured to generate a control signal for controlling to switch on the breaking device; a control signal coupling device, where an input terminal of the control signal coupling device is connected to an output terminal of the control signal generating device, an output terminal of the control signal coupling device is connected to a wire connecting the control device and the breaking device; and the control signal coupling device is configured to couple the control signal to the wire; and a control signal transmission device, where the control signal transmission device is connected with the breaking device and the detection device, and the control signal transmission device is configured to provide a circuit for the control signal.

Preferably, the control signal transmission device is a capacitor.

Preferably, the control signal coupling device is an inductor.

A detection apparatus for a photovoltaic component is provided according to the present disclosure. The detection apparatus includes a detection device and a control device. The control device is configured to control to switch on the breaking device connected to the output terminal of the photovoltaic component, so that the photovoltaic component outputs a voltage or current to the detection apparatus. The detection apparatus is configured to detect, based on the voltage and current outputted from the photovoltaic component, whether the photovoltaic component and the connection circuit for the photovoltaic component operate normally. In this way, a photovoltaic array test for detecting a fault of the photovoltaic component is performed, and a normal operation of the photovoltaic component is ensured.

BRIEF DESCRIPTION OF THE DRAWINGS

In order to more clearly describe technical solutions in the embodiments of the present disclosure, drawings to be used in the description of the conventional technology or the embodiments or are briefly introduced hereinafter. It is apparent that the drawings described below show merely some of embodiments of the present disclosure, and those of ordinary skills in the art may obtain other drawings based on the drawings without any creative effort.

DETAILED DESCRIPTION OF THE EMBODIMENTS

A detection apparatus for a photovoltaic component is provided according to the present disclosure. The detection apparatus is capable of controlling to switch on the breaking device connected to the output terminal of the photovoltaic component, so that the photovoltaic component outputs a voltage or current to the detection apparatus. The detection apparatus detects, based on the voltage and current outputted from the photovoltaic component, whether the photovoltaic component and the connection circuit for the photovoltaic component operate normally. In this way, the photovoltaic array test for detecting a fault of the photovoltaic component is performed, and a normal operation of the photovoltaic component is ensured.

The technical solutions in the embodiments of the present disclosure are described clearly and completely in conjunction with the drawings in the embodiments of the present disclosure hereinafter, so that objectives, technical solutions and advantages of the embodiments of the present disclosure are clearer. Apparently, the described embodiments are some embodiments rather than all the embodiments of the present disclosure. Any other embodiments obtained by those skilled in the art based on the embodiments in the present disclosure without any creative effort fall within the protection scope of the present disclosure.

Figure 1:
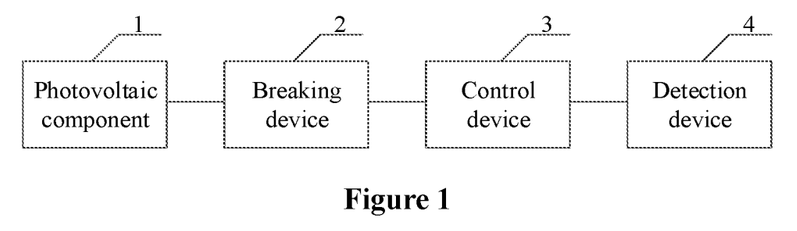
FIG. 1 is a schematic structural diagram of a detection apparatus for a photovoltaic component according to the present disclosure.

Reference is made to FIG. 1. FIG. 1 is a schematic structural diagram of a detection apparatus for a photovoltaic component according to the present disclosure.

An output terminal of the photovoltaic component 1 is connected to a breaking device 2. The detection apparatus includes a detection device 4 and a control device 3.

An input terminal of the detection device 4 is connected to an output terminal of the breaking device 2. The detection device 4 is configured to detect, based on at least one of a voltage and a current outputted from the photovoltaic component 1, whether the photovoltaic component 1 and a connection circuit for the photovoltaic component 1 operate normally.

The control device 3 is connected with the breaking device 2 and the detection device 4. The control device 3 is configured to control switch on the breaking device 2, to transmit the at least one of a voltage and a current outputted from the photovoltaic component 1 to the detection device 4.

Figure 2:
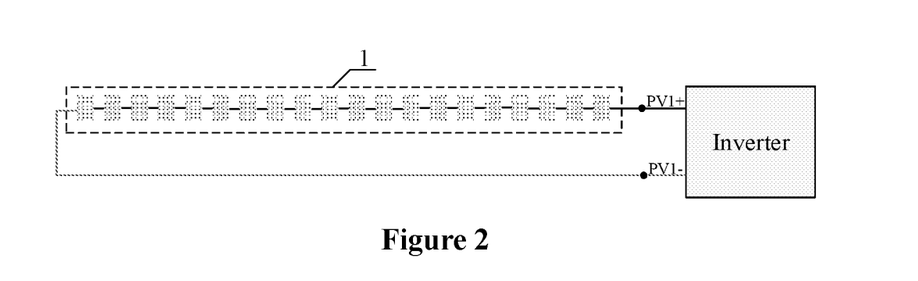
FIG. 2 is a schematic structural diagram showing connection of a photovoltaic component with an inverter according to a conventional technology.
Figure 3:
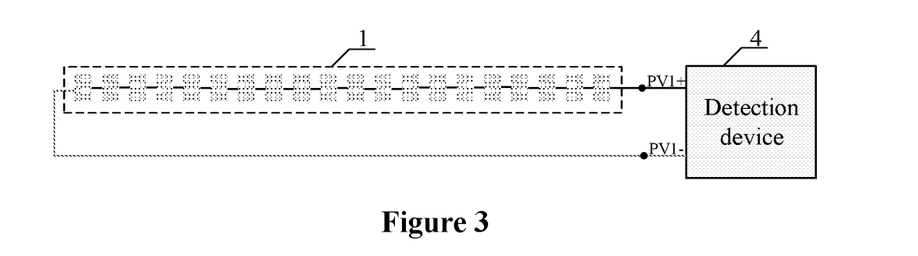
FIG. 3 is a schematic structural diagram of a detection apparatus for a photovoltaic component according to a conventional technology.
Figure 4:
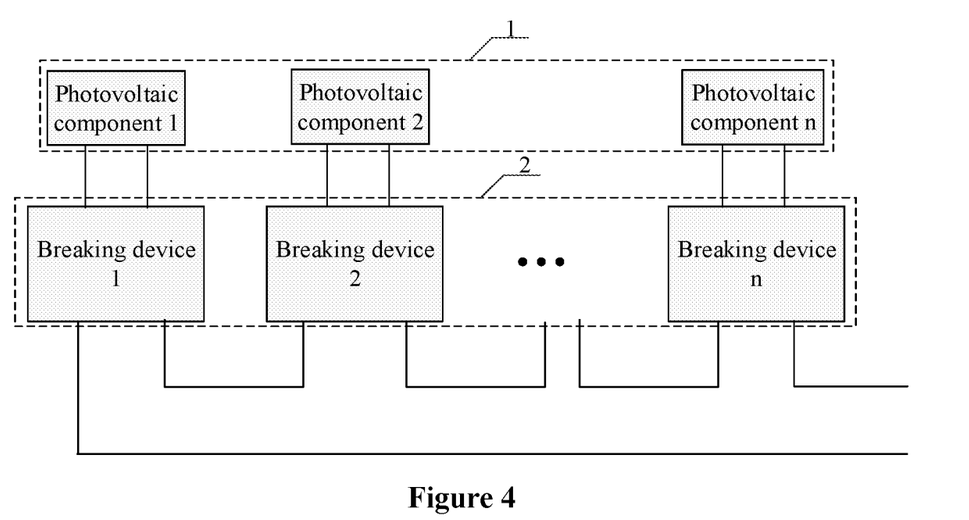
FIG. 4 is a schematic structural diagram showing connection of an output terminal of a photovoltaic component with a breaking device according to a conventional technology.
Figure 5:
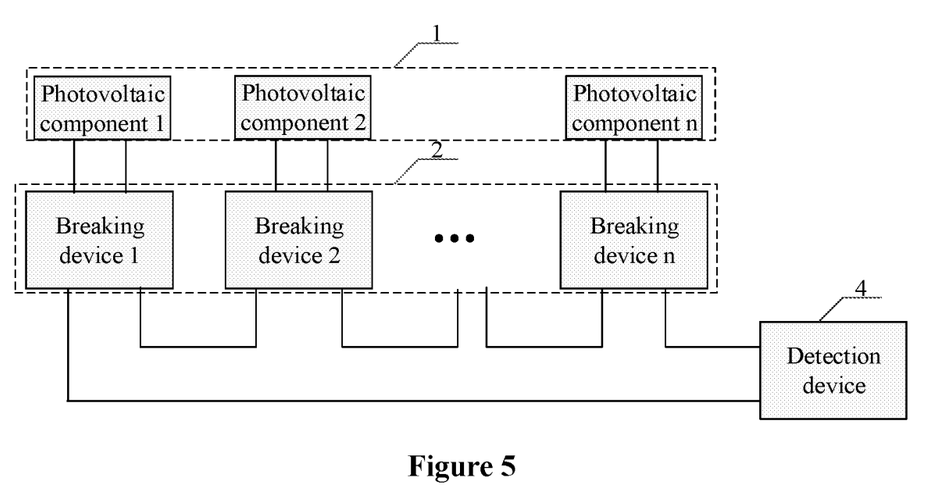
FIG. 5 is a schematic structural diagram showing connection of an output terminal of a photovoltaic component with a breaking device and connection of the breaking device with a detection apparatus according to a conventional technology.

In a conventional technology, the photovoltaic component 1 is connected to an inverter. Reference is made to FIG. 2, which a schematic structural diagram showing connection of a photovoltaic component with an inverter according to a conventional technology. As shown in FIG. 2, a quantity of the photovoltaic component 1 is more than one. The photovoltaic component 1 output a direct current. The inverter converts the direct current into an alternating current and outputs the alternating current to a grid. Before connecting the photovoltaic components 1 to the inverter, a test is usually required on the photovoltaic component 1 and a connection circuit for the photovoltaic component 1. In the test on the photovoltaic component 1 and the connection circuit for the photovoltaic component 1, the photovoltaic component 1 are usually connected to the detection device 4, such as a photovoltaic array tester. Reference is made to FIG. 3, which is a schematic structural diagram of a detection apparatus for a photovoltaic component according to a conventional technology. The photovoltaic array tester detects a voltage and/or current outputted from the photovoltaic component 1, and determines whether the photovoltaic component 1 and the connection circuit for the photovoltaic component 1 are normal. In order to ensure safety of users, an output terminal of the photovoltaic components 1 is usually connected to the breaking device 2. Reference is made to FIG. 4, which is a schematic structural diagram showing connection of an output terminal of a photovoltaic component with a breaking device according to a conventional technology. Reference is made to FIG. 5, which is a schematic structural diagram showing connection of an output terminal of a photovoltaic component with a breaking device and connection of the breaking device with a detection device according to a conventional technology. The breaking device 2 is in a switch-off state in a case of failing to receive a starting signal. Therefore, the photovoltaic component 1 cannot output a voltage and/or a current to the detection device 4; and the detection device 4 cannot perform detection.

Figure 6:
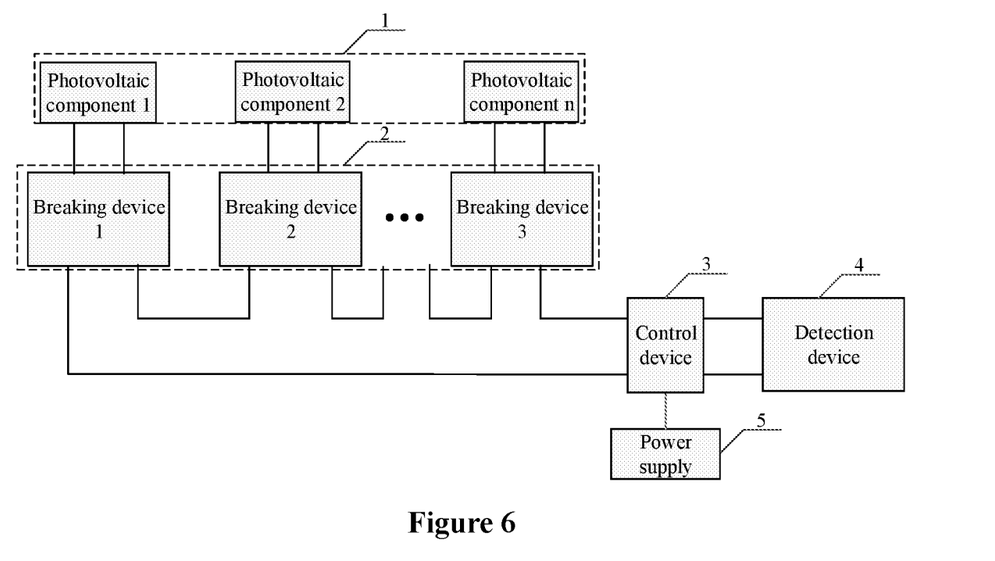
FIG. 6 is a schematic structural diagram of a detection apparatus for a photovoltaic component according to the present disclosure.

In order to solve the technical problems, a detection device 4 and a control device 3, connected with the breaking device 2 and the detection device 4, are provided in a detection apparatus for the photovoltaic component 1 according to the present disclosure. Reference is made to FIG. 6, which is a schematic structural diagram of a detection apparatus for a photovoltaic component according to the present disclosure. The control device 3 is configured to control to switch on the breaking device 2 in a case that detection on the photovoltaic component 1 and the connection circuit for the photovoltaic component 1 is required, to transmit a voltage and/or current outputted from the photovoltaic component 1 to the detection device 4. The detection device 4 is configured to detect, based on the voltage and/or current outputted from the photovoltaic component 1, whether the photovoltaic component 1 and the connection circuit for the photovoltaic component 1 operate normally.

The detection device 4 may be, but is not limited to, a photovoltaic array tester. The detection device 4 may be any other device that can detect, based on the voltage and/or current outputted from the photovoltaic component 1, whether the photovoltaic component 1 and the connection circuit for the photovoltaic component 1 operate normally.

In addition, a voltage detector and a display device may be disposed in the control device 3. After the breaking device 2 is switched on, the voltage and/or current outputted from the photovoltaic component 1 is detected, and a voltage-current curve is displayed through the display to a user, for the user to operate next.

Apparently, in the present disclosure, a resistance to ground of the photovoltaic component 1 may be detected to determine whether the photovoltaic component 1 operates normally.

In addition, in the present disclosure, a PV input terminal of the control device 3 is connected to a PV output terminal of the breaking device 2, and a PV input terminal of the detection device 4 is connected to a PV output terminal of the control device 3.

It should be noted that the detection on the connection circuit for the photovoltaic component 1 in the present disclosure refers to detection on a cable and a connector connecting various parts in the circuit to determine whether the cable and the connector operate normally, so as to ensure normal operation of the circuit.

It should be noted that in the conventional technology, multiple photovoltaic components 1 are usually connected in series to form a component array. An output terminal of each photovoltaic component 1 is connected to a breaking device 2. Each breaking device 2 controls output of the photovoltaic component 1 connected to the breaking device 2. The detection apparatus for the photovoltaic component 1 in the present disclosure can detect whether damage occurs in the array of the photovoltaic components 1. Without considering a cost, the detection apparatus for the photovoltaic component 1 in the present disclosure can further determine whether the damage occurs at the photovoltaic component 1, or the cable or connector, which is not limited in the present disclosure.

In addition, in the present disclosure, the control device 3 couples a control signal to a power line connected to the breaking device 2. The breaking device 2 is provided with a PLC (powerline communication) communication module. The PLC communication module is configured to acquire a control signal from the power line. In a case that a control signal is acquired from the power line, a switch in the breaking device 2 and connected to the output terminal of the photovoltaic component 1 is switched on, so that the photovoltaic component 1 outputs a voltage and/or current normally. In a case that no control signal is acquired from the power line, the switch in the breaking device 2 and connected to the output terminal of the photovoltaic component 1 is switched off, so that an output of the photovoltaic component 1 is disconnected.

Furthermore, a power supply 5 is connected to a power input terminal of the control device 3, in order to ensure the normal operation of the control device 3. Referring to FIG. 6, the power supply 5 may be, but is not limited to, a mobile power bank or a fixed power supply. The power supply 5 may be any other power supply that can supply power to a control module.

A connection and an operation sequence for the detection apparatus for the photovoltaic component 1 in the present disclosure are described as follows. Output terminals of multiple photovoltaic components 1 are connected to multiple breaking devices 2, respectively. The breaking devices 2 are connected in series. Output terminals of breaking device 2 at both ends of the series connection of the breaking devices 2 are connected to a power line, that is, a PV+ output terminal and a PV− output terminal are connected to power lines, respectively. A power line connected to the PV+ output terminal of the breaking devices 2 is connected to a PV+ input terminal of the control device 3, and a power line connected to the PV− output terminal of the breaking devices 2 is connected to a PV− input terminal of the control device 3. The PV+ output terminal of the control device 3 is connected to a PV+ input terminal of the detection device 4, and the PV− output terminal of the control device 3 is connected to a PV− input terminal of the detection device 4. The power input terminal of the control device 3 is connected to the power supply 5. The control device 3 may be provided with an indicator lamp. The indicator lamp is lit up when powered by the power supply 5, indicating that a control signal is outputted by the control device 3. After a predetermined time period, the multiple breaking devices 2 are all switched on, and the detection device 4 performs detection on the photovoltaic components 1 and the connection circuit for the photovoltaic components 1 based on the voltage and/or current outputted by the photovoltaic components 1.

In summary, the control device 3 controls the breaking device 2 connected to the output terminal of the photovoltaic component 1 to be switched on, to cause the photovoltaic component 1 to output a voltage and/or a current to the detection device 4, so that the detection device 4 detects whether the photovoltaic component 1 and the connection circuit for the photovoltaic component 1 operate normally based on the voltage and/or current outputted by the photovoltaic component 1. That is, the photovoltaic array test for detecting a fault of a photovoltaic component 1 can be performed, so that normal operation of the photovoltaic component 1 is ensured.

Preferred embodiments on the basis of the above embodiments are described below.

In a preferred embodiment, the detection apparatus for a photovoltaic component further includes a power supply 5. An output terminal of the power supply 5 is connected to the power input terminal of the control device 3. The power supply 5 is configured to supply power to the control device 3.

In this embodiment, the power supply 5 is provided to supply power to the control device 3, so as to ensure normal operation of the control device 3. Therefore, the control device 3 controls to switch on the breaking device 2, and the detection device 4 performs detection on the photovoltaic component 1 and the connection circuit for the photovoltaic component 1.

It should be noted that in the present disclosure, the control device controls to switch on each breaking device 2 immediately after the power supply 5 powers the control device.

In a preferred embodiment, the power supply 5 is a mobile power bank.

In this embodiment, the mobile power bank serves as the power supply 5 and supplies power to the control device 3. The mobile power band ensures normal operation of the control device 3 and can be moved at any time, which is convenient for user operation.

Apparently, in the present disclosure, the power supply 5 is not limited to the mobile power bank. The power supply 5 may be any other power supply that can supply power to the control device 3.

In a preferred embodiment, the detection apparatus for a photovoltaic component further includes a prompting device. The prompting device is connected to the detection device 4, and is configured to provide a prompt to a user based on a detection result of the detection device 4.

In this embodiment, it is considered that a staff needs to be informed in a case that the detection device 4 detects that the voltage and/or current outputted from the photovoltaic component 1 is abnormal, the power supply is undervoltage, or devices are automatically shut off due to long-term inactivity. Therefore, the prompting device is provided. In a case that an abnormality is detected by the detection device 4, the prompting device is controlled to indicate the abnormality to prompt the staff to perform process on the photovoltaic component 1 and the connection circuit for the photovoltaic component 1.

In addition, the prompting device may be controlled to indicate a normal condition in a case that the detection device 4 detects that the voltage and/or current outputted from the photovoltaic component 1 is normal.

In a preferred embodiment, the prompting device may be a sound prompting device and/or a visual prompting device.

In this embodiment, the prompting device includes a sound prompting device or a visual prompting device. The sound prompting device is configured to provide a sound prompt, and the visual prompting device is configured to provide a light prompt.

The prompting device may include only one of the sound prompting device and the visual prompting device. Alternatively, the prompting device may include both the sound prompting device and the visual prompting device. In a case that the prompting device includes both the sound prompting device and the visual prompting device, a staff cannot hear a sound prompt in a noisy environment, but can acquire a detection result of the detection device 4 through the visual prompting device; or the staff cannot see the visual prompting device within a field of view, but can acquire the detection result of the detection device 4 through the sound prompting device. Therefore, an abnormality of the photovoltaic component 1 and the connection circuit for the photovoltaic component 1 can be processed quickly.

In a preferred embodiment, the sound prompting device is a buzzer, and the visual prompting device is an indicator lamp.

In this embodiment, the buzzer is adopted as the sound prompting device for providing a sound prompt, and the indicator lamp is adopted as the visual prompting device for providing a light prompt.

In addition, the buzzer has a low cost and high sensitivity. The light-emitting diode has an advantage of a low cost, and may share a same control port with the buzzer.

Figure 7:
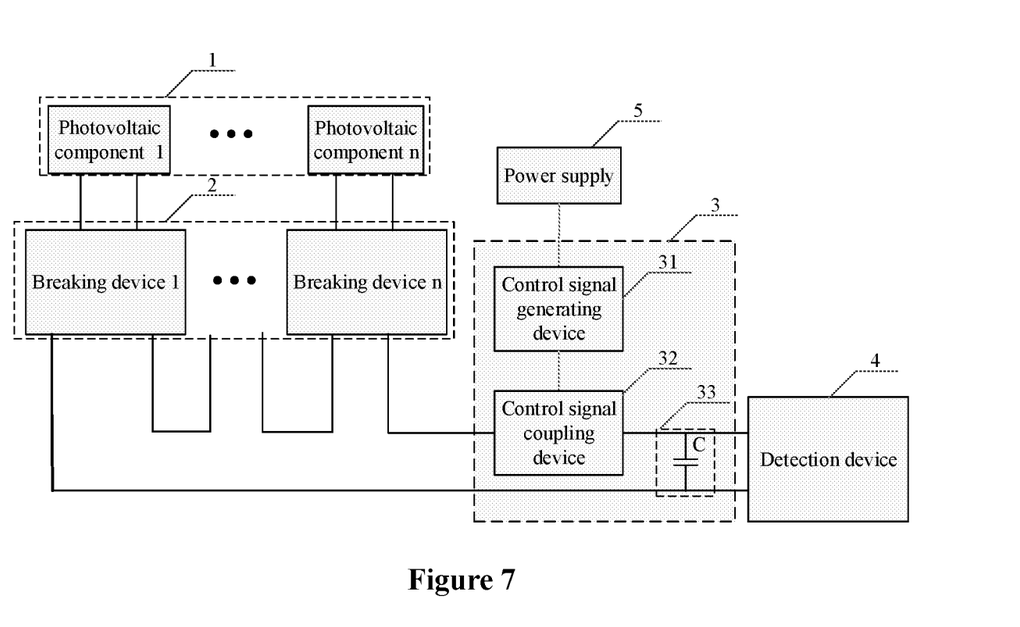
FIG. 7 is a schematic structural diagram of a control device according to the present disclosure.

In a preferred embodiment, the control device 3 includes a control signal generating device 31, a control signal coupling device 32, and a control signal transmission device 33.

A power input terminal of the control signal generating device 31 serves as a power input terminal of the control device 3. The control signal generating device 31 is configured to generate a control signal for controlling to switch on the breaking device 2.

An input terminal of the control signal coupling device 32 is connected to an output terminal of the control signal generating device 31. An output terminal of the control signal coupling device 32 is connected to a wire connecting the control device 3 and the breaking device 2. The control signal coupling device 32 is configured to couple a control signal to the wire.

The control signal transmission device 33 is connected with the breaking device 2 and the detection device 3. The control signal transmission device 33 is configured to provide a circuit for the control signal.

In this embodiment, the control device 3 includes the control signal generating device 31, the control signal transmission device 33 and the control signal coupling device 32. Reference is made to FIG. 7, which is a schematic structural diagram of a control device according to an embodiment of the present disclosure. The control signal generating device 31 is configured to generate a control signal in a case that detection on the photovoltaic component 1 and the connection circuit for the photovoltaic component 1 is performed. The control signal coupling device 32 is configured to couple the control signal to a power line connected to the breaking device 2, so that the breaking device 2 is switched on in a case that a control signal on the power line is detected, and thereby the photovoltaic component 1 outputs a voltage to the detection device 4.

In addition, it is considered that there is no complete circuit for transmitting the control signal in a case that the control device 3 is connected to the breaking device 2. Therefore, the control signal transmission device 33 according to this embodiment is configured to provide a circuit for transmitting the control signal. Thereby, the breaking device 2 is controlled to be switched on normally.

It should be noted that the control signal coupling device 33 in the present disclosure is configured to couple the control signal to the power line connected to a PV input terminal of the control signal coupling device 33.

In a preferred embodiment, the control signal transmission device 33 is a capacitor C.

In this embodiment, the capacitor C is disposed as the control signal transmission device 33. As shown in FIG. 7, a first terminal of the capacitor C is connected to a first output terminal of the breaking device 2 and a first input terminal of the detection device 3, and a second terminal of the capacitor C is connected to a second output terminal of the breaking device 2 and a second input terminal of the detection device 3. The capacitor C realizes a circuit for the control signal, and has advantages of a low cost and a simple connection.

Apparently, in the present disclosure, the control signal transmission device 33 is not limited to the capacitor C, and a capacity of the capacitor C is not limited, as long as a circuit for the control signal can be realized.

In a preferred embodiment, the control signal coupling device 32 is an inductor.

In this embodiment, the inductor is disposed as the control signal coupling device 32. The inductor is configured to couple the control signal to the power line, and has a low cost and a simple connection.

Apparently, in the present disclosure, the control signal coupling device 32 is not limited to the inductor, as long as the control signal can be coupled to the power line.

It should also be noted that in the specification, relational terms such as "first" and "second" are merely for distinguishing one entity or operation from another, rather than indicating or implying an actual relationship or order of these entities or operations. In addition, terms "include", "comprise" or any other variants are intended to be non-exclusive. Therefore, a process, a method, an article or an apparatus including multiple elements includes not only the elements but also other elements that are not enumerated, or also include the elements inherent for the process, the method, the article or the apparatus. Unless expressively limited otherwise, a process, a method, an article or an apparatus limited by "comprising/including a(n) . . . " does not exclude existence of another identical element in such process, method, article or apparatus.

The above description of the embodiments enables those skilled in the art to implement or use the present disclosure. Many modifications to these embodiments are apparent for those skilled in the art. The general principles defined herein may be applied to other embodiments without departing from the spirit or scope of the present application. Therefore, the present disclosure should not be limited to the embodiments disclosed herein, but has the widest scope in accordance to the principle and the novel features disclosed herein.

The invention claimed is:

1. A detection apparatus for a photovoltaic component, wherein an output terminal of the photovoltaic component is connected to a breaking device, and the detection apparatus comprises:
a detection device, which has an input terminal connected to an output terminal of the breaking device, wherein the detection device is configured to test, based on a voltage and/or a current outputted from the photovoltaic component, whether the photovoltaic component and a connection circuit for the photovoltaic component operate normally; and
a control device connected with the breaking device and the detection device, wherein the control device is configured to control to switch on the breaking device in response to the control device being powered on, to transmit the voltage and/or the current outputted from the photovoltaic component to the detection device.

2. The detection apparatus for a photovoltaic component according to claim 1, further comprising:
a power supply, which has an output terminal connected to a power input terminal of the control device, wherein the power supply is configured to supply power to the control device.

3. The detection apparatus for a photovoltaic component according to claim 2, wherein the power supply is a mobile power bank.

4. The detection apparatus for a photovoltaic component according to claim 1, further comprising:
a prompting device connected to the detection device, wherein the prompting device is configured to provide a prompt to a user based on a detection result of the detection device.

5. The detection apparatus for a photovoltaic component according to claim 4, wherein the prompting device is at least one of a sound prompting device and a visual prompting device.

6. The detection apparatus for a photovoltaic component according to claim 5, wherein
the sound prompting device is a buzzer, and
the visual prompting device is an indicator lamp.

7. The detection apparatus for a photovoltaic component according to claim 1, wherein the control device comprises:
a control signal generating device, wherein
a power input terminal of the control signal generating device serves as a power input terminal of the control device, and
the control signal generating device is configured to generate a control signal for controlling to switch on the breaking device;
a control signal coupling device, wherein
an input terminal of the control signal coupling device is connected to an output terminal of the control signal generating device,
an output terminal of the control signal coupling device is connected to a wire connecting the control device and the breaking device, and
the control signal coupling device is configured to couple the control signal to the wire; and
a control signal transmission device, wherein
the control signal transmission device is connected with the breaking device and the detection device, and
the control signal transmission device is configured to provide a circuit for the control signal.

8. The detection apparatus for a photovoltaic component according to claim 7, wherein the control signal transmission device is a capacitor.

9. The detection apparatus for a photovoltaic component according to claim 7, wherein the control signal coupling device is an inductor.

* * * * *